United States Patent
Yasuda (10) Patent No.: US 7,076,739 B2
(45) Date of Patent: Jul. 11, 2006

(54) DATA COMPUTATION APPARATUS AND METHOD FOR USING THE DATA COMPUTATION APPARATUS FOR ADJUSTMENT OF ELECTRONIC CONTROLLER

(75) Inventor: Takeshi Yasuda, Kobe (JP)

(73) Assignee: Fujitsu Limited, Kobe (JP)

( * ) Notice: Subject to any disclaimer, the term of this patent is extended or adjusted under 35 U.S.C. 154(b) by 576 days.

(21) Appl. No.: 10/104,029

(22) Filed: Mar. 25, 2002

(65) Prior Publication Data

US 2002/0138227 A1 Sep. 26, 2002

(30) Foreign Application Priority Data

Mar. 26, 2001 (JP) .............................. 2001-088181

(51) Int. Cl.
*G06F 3/00* (2006.01)

(52) U.S. Cl. ...................... 715/769; 715/853; 715/771

(58) Field of Classification Search ................ 715/769, 715/764, 771, 810, 835–839, 845, 853–855, 715/700, 961, 965, 970, 763, 796, 967; 702/108, 702/120; 717/104, 132
See application file for complete search history.

(56) References Cited

U.S. PATENT DOCUMENTS

| | | | |
|---|---|---|---|
| 5,301,336 A * | 4/1994 | Kodosky et al. ............ 715/846 |
| 5,861,882 A * | 1/1999 | Sprenger et al. ........... 715/700 |
| 5,874,964 A * | 2/1999 | Gille .......................... 715/853 |
| 5,884,078 A * | 3/1999 | Faustini ..................... 719/315 |
| 5,987,246 A * | 11/1999 | Thomsen et al. .......... 717/109 |
| 6,282,547 B1 * | 8/2001 | Hirsch ........................ 707/102 |
| 6,418,391 B1 * | 7/2002 | Umezu et al. .............. 702/123 |
| 6,425,121 B1 * | 7/2002 | Phillips ...................... 717/109 |
| 6,477,486 B1 * | 11/2002 | Ram et al. .................. 702/188 |
| 6,493,003 B1 * | 12/2002 | Martinez ..................... 715/781 |
| 6,782,331 B1 * | 8/2004 | Ayadi .......................... 702/68 |
| 6,810,508 B1 * | 10/2004 | Bloom et al. ................. 716/4 |
| 2002/0095310 A1 * | 7/2002 | Kobayashi et al. ............ 705/1 |
| 2002/0186259 A1 * | 12/2002 | Meandzija et al. ......... 345/853 |
| 2003/0007005 A1 * | 1/2003 | Kandogan ................... 345/763 |
| 2003/0231215 A1 * | 12/2003 | Day .......................... 345/835 |

* cited by examiner

*Primary Examiner*—Sy D. Luu
(74) *Attorney, Agent, or Firm*—Oliff & Berridge PLC (57) ABSTRACT

The connector groups including input boards 13, 14 and 15, a model computing portion 16 and output boards 17, 18 and 19 in an HILS 11 are displayed in lists 24, 25 and 26 on a screen of a display device 22. A drag-and-drop function, using an input device 23, is performed to connect these connectors. In the lists 24, 25 and 26, different colors are employed to distinguish processed connectors from unprocessed connectors. When an unprocessed connector is designated, connection candidates are also displayed, or an unprocessed connector is automatically connected to a connection candidate having the highest preference level.

13 Claims, 5 Drawing Sheets

DATA COMPUTATION APPARATUS AND METHOD FOR USING THE DATA COMPUTATION APPARATUS FOR ADJUSTMENT OF ELECTRONIC CONTROLLER

BACKGROUND OF THE INVENTION

1. Field of the Invention

The present invention relates to a data computation apparatus that, through data computation, measures or simulates movement of an actual object to be controlled and develops, tests or inspects an electronic controller. The invention also relates to a method for adjusting an electronic controller using the data computation apparatus.

2. Description of the Related Art

Conventionally, a multiple electronic control unit (hereinafter referred to as an "ECU") is mounted on a vehicle, and various control operations, such as for engine control, are electronically performed. During the development process for a new vehicle, an object to be controlled, such as an engine, and an electronic controller, such as an ECU, are developed in parallel. Therefore, for the development of an ECU, the process must be initiated before the object to be controlled, such as an engine, actually exists. In any event, for efficient development, the movement or the action of the object to be controlled must be simulated.

Figure 7:
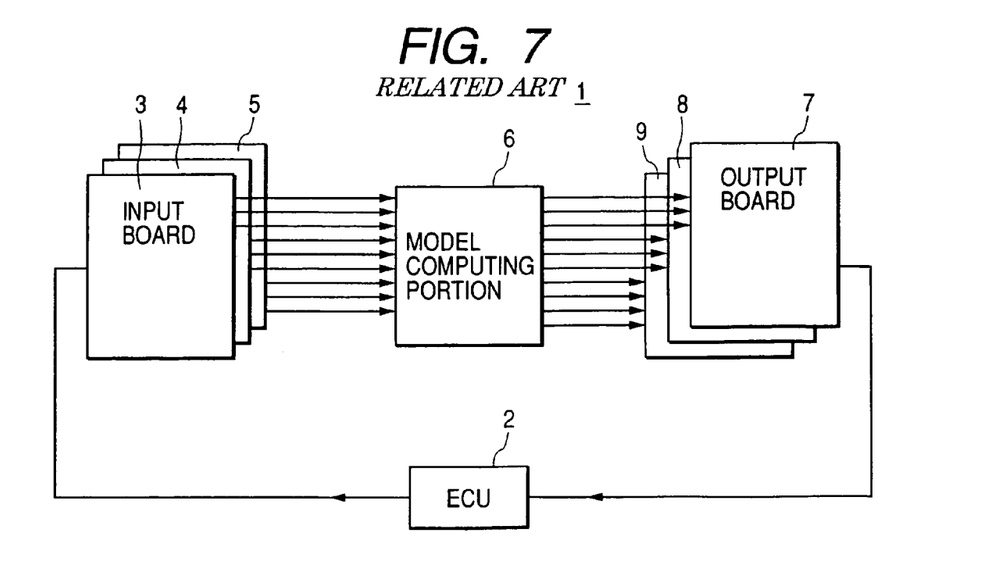
FIG. 7 is a schematic block diagram showing a system configuration for a conventional data computation apparatus.

FIG. 7 is a schematic diagram showing the configuration of an HILS (Hardware In the Loop Simulation system) 1 that is conventionally used for simulating an engine when an ECU is being developed. The HILS 1, which generates a pseudo signal that serves as a substitute for the movement or the action of an engine to be controlled, is used to confirm, or test or inspect, the ECU 2 operation that is used for engine control. The HILS 1 includes multiple input boards 3, 4 and 5, a model computing portion 6, and multiple output boards 7, 8 and 9. When the connection between the input boards 3, 4 and 5 and the model computing portion 6, or the connection between the model computing portion 6 and the output boards 7, 8 and 9 is changed, the move mentor the action of an object to be simulated can be altered, and the simulation for general use can be performed.

Multiple input ports and multiple output ports are provided for the input boards 3, 4 and 5 and the output boards 7, 8 and 9. While the model computing portion 6 includes input connectors that can be connected to the input ports, and output connectors that can be connected to the output ports. With the HILS 1, data received at the input ports of the input boards 3, 4 and 5 are employed for computations performed by the model computing portion 6, and the results that are thus obtained are output through the output ports of the output boards 7, 8 and 9. For the pre-operation preparation of the HILS 1, much labor is required to set, as needed, the input ports, the input and output terminals of the model computing portion 6, and the output ports, and as the count of the ports and the input/output terminals of the model computing portion 6 that are employed is increased, the connection becomes ever more complicated, and identifying the setup state is not easy.

A conventional technique whereby, for a personal computer, I/O ports are interconnected by a GUI (Graphical User Interface) that provides drag-and-drop mouse functionality is disclosed in, for example, JP-A-8-241185. According to this technique, multiple test elements are displayed as icons, and the icons are connected by drawing lines in a manner such as is used for creating a block diagram, so that a test system for a wireless device can be re-constructed. Multiple ports are displayed for icons corresponding to the test elements that include multiple I/O ports, and one icon is connected to another by performing a drag-and-drop operation for each port.

The reconstruction method as disclosed in JP-A-8-241185 is easy for users to understand. However, when the number of ports for an icon is increased, the connection operation is difficult and the connection state is not easily identified, as in a wiring diagram for an electronic circuit substrate on which is mounted a semiconductor integrated circuit having multiple connection terminals. As was previously described, the number of ports and the input/output terminals of the model computing portion 6 are increased for the HILS 1 that simulates the engine of a vehicle, and using the method disclosed in JP-A-8-241185, it is difficult to perform the setting operation and to identify the setting state.

SUMMARY OF THE INVENTION

An object of the present invention is to provide a data computation apparatus that can facilitate the interconnection of ports, even when there is an increase in the number of ports, and that can efficiently adjust an electronic controller through data computation and simulation, and a method for adjusting an electronic controller by using the data computation apparatus.

To achieve the object, according to the invention, there is provided a data computation apparatus comprising:

an input unit including a plurality of input ports for data input;

an output unit including a plurality of output ports for data output;

an internal computing portion including a plurality of input terminals connectable to the input ports of the input unit and a plurality of output terminals connectable to the output ports of the output unit, the internal computing portion for performing a computation based on data received by the input unit and to output computation results from the output unit;

a list display unit for displaying on a screen a list arranged in the order of the input ports of the input unit, the input terminals of the internal computing portion, the output terminals of the internal computing portion and the output ports of the output unit, each grouped as a connector;

an input operation unit for designating the connectors on the adjacent lists by a drag-and-drop operation to issue a connection instruction; and a connection controller for logically connecting the connectors on adjacent lists in response to the connection instruction by the input operation unit.

Thus, even when the connection of many cables must be instructed, the connection instructions can be issued as the process is being performed, so that a connection relationship can easily be established. In response to the drag-and-drop operation used by the input operation unit, the connection controller can logically connect the connectors between the adjacent lists as instructed. Thus, in accordance with the drag-and-drop operation, logic connections using the input operation unit can be precisely performed.

The list display unit displays the lists to distinguish the processed connectors from the unprocessed connectors.

When different colors are employed to display processed and unprocessed connectors, the unprocessed connectors can be identified at a glance. Further, it is possible to prevent the premature adjustment of an electronic controller serving as a data computation apparatus while unprocessed connectors still remain.

The list display unit displays the lists to distinguish the connectors each connected to the single connector from the connector connected to the plurality of connectors, of the connectors that have been processed.

According to the invention, by using different colors, a connector that has multiple connections can be distinguished from a connector that has only one connection. Thus, when the connection state between two connectors having multiple connections is to be altered, an action that will affect other connectors, the different colors will enable a user to distinguish between the pertinent connectors and others for which connections have a one-to-one correspondence. This will ensure that the user is aware of the current connection state and does not overlook multiple connections.

The input operation unit provides constant data for the connector. The list display unit displays the lists to distinguish the connector provided with the constant data from the unprocessed connectors and the processed connectors.

Since specific data, such as constant or time series data, tends to change each time a measurement or simulation is performed, a connector set to such data can be distinguished from other connectors, and as required, the setting can be quickly changed, thereby enabling the efficient management of the settings.

Each of the lists has a hierarchical structure in which the connectors in one of the lists is classified into a plurality of ranks. The list display unit generally displays the connectors in the topmost rank of the lists. If one of the connectors is not displayed on the list regardless of designation of the one of the connectors by the input operation unit, the hierarchical structure is extended and displayed from the topmost rank to a rank including the one of the connectors to display the one of the connector designated by the input operation unit.

According to the invention, instead of displaying all the many connectors on the lists, the connectors in the topmost rank of multiple ranks are displayed, so that the user can easily identify the connection relationship. To confirm the connection relationship, the hierarchical structure is displayed, beginning with the topmost rank, until the connector at the destination is reached, so that on the display the actual connections can be easily identified.

The data computation apparatus further comprises a candidate selection section for selecting connectors as destination candidates for an unprocessed connector together with preference levels and in accordance with a predetermined reference. The connection controller connects the unprocessed connector to a connector having the highest preference level in the destination candidates.

When a user employs the input operation unit to designate an unprocessed connector, connection destination candidates are selected by the candidate selection section and are displayed near the designated connector. Therefore, from among these candidates the user can designate and select an appropriate connector.

A name may be provided for each of the connectors in accordance with a rule determined in advance and the candidate selection section may select the candidates based on matching or similarity of the name provided for the connectors.

Because the unprocessed connector is connected to a connector having the highest preference level among those selected by the candidate selection section, the work performed by the user may be reduced.

The predetermined reference is established using a file indicating a correlation in the candidate selection section.

According to the invention, when the user names the connectors with appropriate regularity, the destination candidates for the unprocessed connectors can be appropriately selected.

The user can establish a correlation file to serve as the reference for the selection of the destination candidates for the unprocessed connector, and based on the file, can select a connector candidate.

The candidate selection section corrects the predetermined reference based on the record of past connections.

According to the invention, since the connection record for connectors that were previously connected is employed to correct the reference used for the selection of destination candidates for the unprocessed connector, the connection trend evidenced by the selections of a user can be learned, and candidates that closely reflect the desires of the user can be selected.

According to the invention, there is provided a method for employing a data computation apparatus to adjust an electronic controller comprises the steps of:

employing the above data computation apparatus to perform data computations for simulating the movement of an object to be controlled; and adjusting the electronic controller.

According to the invention, in the process for the development or the production of an electronic controller, an object to be controlled is easily simulated by a data computation apparatus, and the electronic controller can be adjusted appropriately.

DETAILED DESCRIPTION OF THE PRESENT INVENTION

Figure 1:
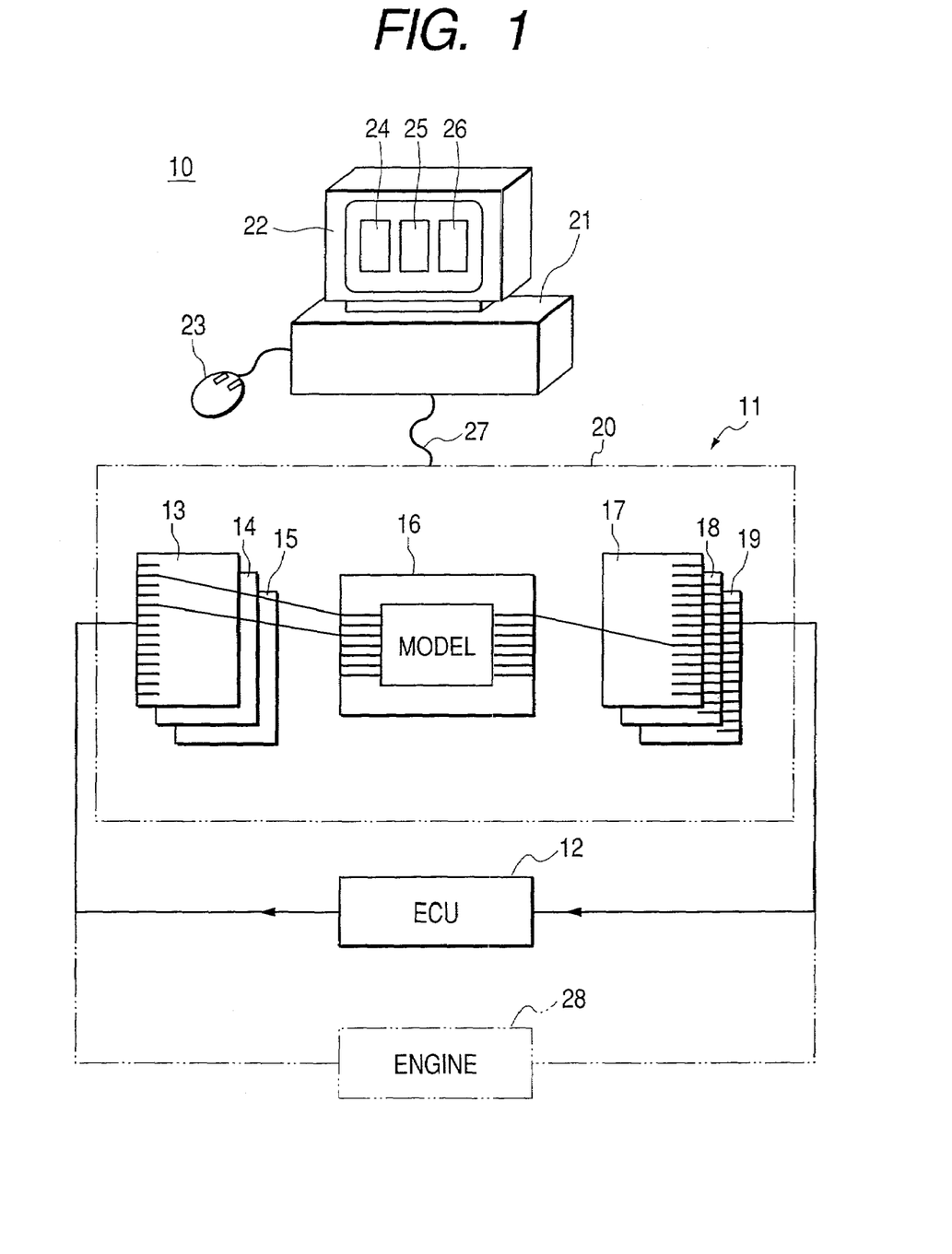
FIG. 1 is a schematic block diagram showing a system configuration for a data computation apparatus 10 according to one embodiment of the present invention.

FIG. 1 is a schematic diagram showing the system configuration of a data computation apparatus 10 according to one embodiment of the invention. The data computation apparatus 10 includes an HILS 11 that is the same as the HILS 1 in FIG. 7, and simulates an object to be controlled at the adjustment time, inspecting or testing an ECU 12. The HILS 11 includes multiple input boards 13, 14 and 15, a model computing portion 16, and multiple output boards 17, 18 and 19. The input boards 13, 14 and 15 include boards for which input signal types differ, such as analog input, pulse input and digital input signal types. The output boards 17, 18 and 19 also include boards for which output signal types differ, such as analog output, pulse output and digital output signal types.

In the HILS 11, the model computing portion 16 computes data received at the input ports of the input boards 13, 14 and 15, and transmits the obtained results to the output ports of the output boards 17, 18 and 19. When a connection is changed between the input ports of the input boards 13, 14 and 15 and the input connectors of the model computing portion 16, or between the output connectors of the model computing portion 16 and the output ports of the output boards 17, 18 and 19, a movement of or an action by the object to be simulated can also be changed. The input boards 13, 14 and 15 maybe connected to the output boards 17, 18 and 19, and the input boards 13, 14 and 15, the model computing portion 16 and the output boards 17, 18 and 19, all of which are constituents of the HILS 11, are mounted in a measurement rack 20.

For the data computation apparatus 10 of this embodiment, a common computer, such as a personal computer 21, is connected to the HILS 11. The personal computer 21 includes a display device 22 that employs a cathode ray tube (CRT), and a liquid crystal display that displays (LCD) images; and an input device 23 that includes a pointing device, such as a mouse. On the screen of the display device 22 that serves as the list display unit, lists 24, 25 and 26 that will be described later are displayed in correlation with the input boards 13, 14 and 15, the model computing portion 16 and the output boards 17, 18 and 19. A connection instruction can be issued when the pointing device, such as the mouse, of the input device 23 that serves as an input unit is employed to perform the drag-and-drop function for the lists 24, 25 and 26. Instructions for selecting or switching various functions can also be issued by the input device 23. The results of the connection instruction are transmitted, via an interface cable 27, to the HILS 11 constituting the connection controller by the personal computer 21, and the connections among the input boards 13, 14 and 15, the model computing portion 16 and the output boards 17, 18 and 19 are established. The data computation apparatus 10 can simulate the movement and the actions of a vehicle engine 28 to be controlled by the ECU 12.

In the data computation apparatus 10 of this embodiment, the model computing portion 16, which is an internal computing portion, performs computations based on the data received from the input boards 13, 14 and 15, which are input units and which include multiple input ports used for data reception. The model computing portion 16 then outputs the obtained results to the output boards 17, 18 and 19, which are output units that have the output ports used for data output. The model computing portion 16 includes multiple input terminals that can be connected to the input ports of the input boards 13, 14 and 15, and multiple output terminals that can be connected to the output ports of the output boards 17, 18 and 19. On the screen of the display device 22, lists of connector groups are displayed in the order corresponding to that of the input ports, the input terminals, the output terminals and the output ports.

Figure 2A:
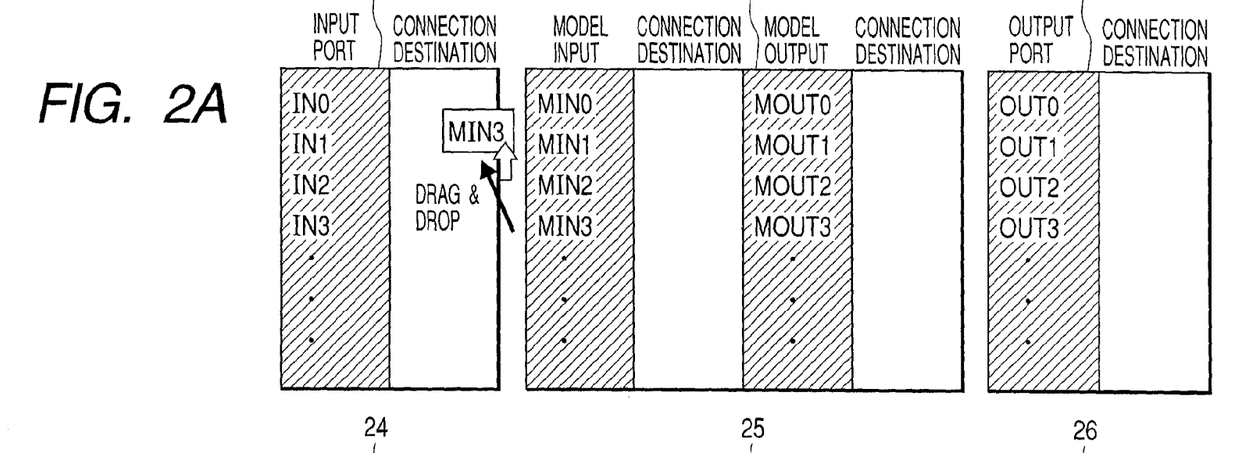
FIGS. 2A and 2B are diagrams showing the state according to the embodiment in FIG. 1 wherein connectors on lists are connected by the performance of a drag-and-drop function.
Figure 2B:
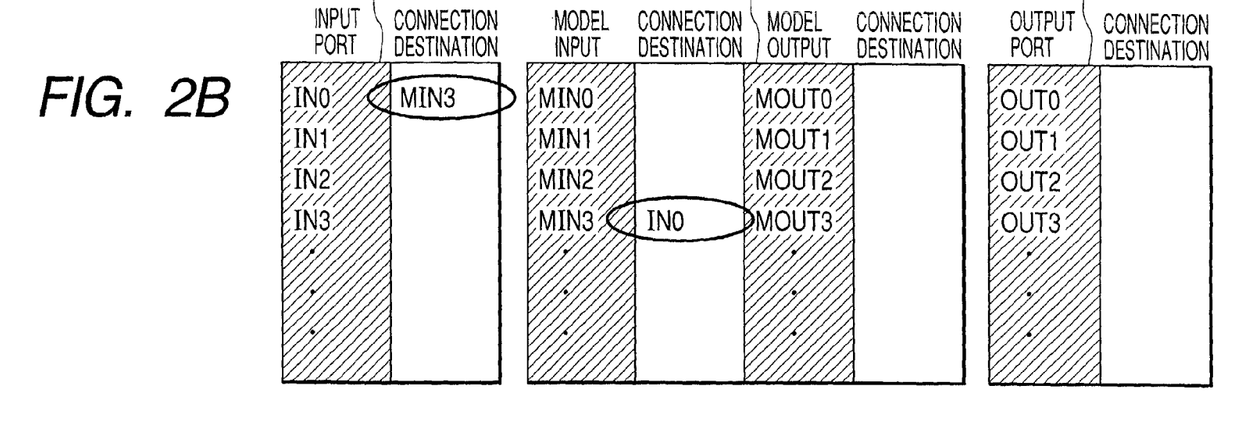

FIGS. 2A and 2B are diagrams showing the lists 24, 25 and 26 displayed on the screen of the display device 22 in FIG. 1. As is shown in FIG. 2A, input ports IN0, IN1, . . . of the input boards 13, 14 and 15, model input terminals MIN0, MIN1, . . . and model output terminals MOUT0, MOUT1, . . . of the model computing portion 16, and output ports OUT0, OUT1, . . . of the output boards 17, 18 and 19 are grouped together by connected destinations, and are respectively displayed on the lists 24, 25 and 26. When one of the connectors on the lists, e.g., model input terminal MIN3 on the list 25, is designated using a mouse and the drag-and-drop function is performed down to the input port IN0 on the list 24, as indicated by elliptics in FIG. 2B, the destinations for the individual connectors are displayed. Further, the model input terminal MIN3 is displayed as the connection destination of the input port IN0 on the list 24, and the input port IN0 is displayed as the connection destination of the model input terminal MIN3 on the list 25.

As is described above, relative to the list 24, 25 or 26 on the display device 22, a connection instruction can be issued by the input device 23 through the drag-and-drop function, while the connector on the adjacent list 24, 25 or 26 is designated. In response to the drag-and-drop function using the input device 23, the personal computer 20 electrically connects the connectors on the adjacent lists as instructed. Since the lists 24, 25 and 26 of the connector groups are displayed on the screen in the order corresponding to that of the input ports, the input terminals, the output terminals and the output ports, even when many connectors are provided, they can be grouped in accordance with the processing order, and can be arranged and displayed so that they are easily identified. Since a connection instruction can be issued for a connector on the list 24, 25 or 26 using the drag-and-drop function, while a connector on the adjacent list 24, 25 or 26 is designated, even when instructions must be provided for many cables, a connection instruction can be issued in accordance with the processing order and a connection relationship can easily be established.

Further, for identification purposes, different colors, as well as shading or blinking, are used to display and identify processed connectors and unprocessed connectors in the lists on the display device 22. And since the colors for the connected state and the unconnected state differ, unprocessed connectors can be identified at a glance, and it is possible to prevent the adjustment of the ECU 12, as the data computation apparatus 10, while unprocessed connectors still remain.

Figure 3A:
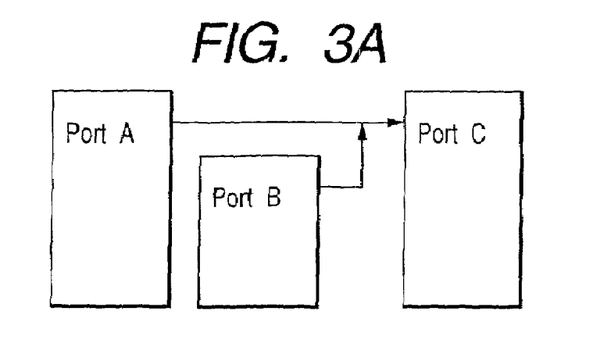
FIGS. 3A and 3B are simplified block diagrams showing an example wherein connectors are not connected with a one-to-one correspondence.
Figure 3B:
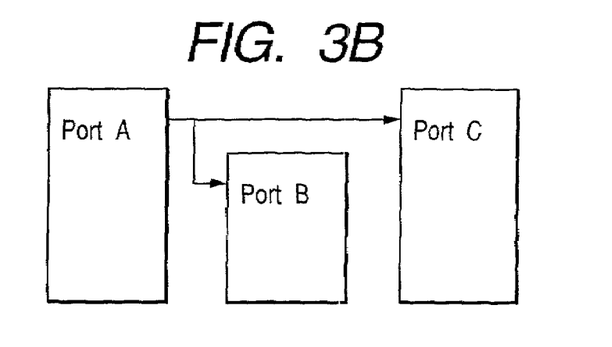

FIGS. 3A and 3B are diagrams showing examples wherein there is no one-to-one correspondence of connections. In FIG. 3A, output ports PortA and PortB are connected to single input port PortC, while in FIG. 3B, single output port PortA is connected to input ports PortB and PortC. And while the connection in FIG. 3A is generally avoided because, so long as an output circuit is not an open collector or an open drain, the connection of outputs normally occurs when high level data is output by output port PortA and low level data is output by the other output port PortB. Therefore, when the connection in FIG. 3A is designated, it is preferable that an error alarm be generated.

The connection in FIG. 3B, therefore, is generally employed. However, when multiple connectors are connected, it is preferable that these connectors be displayed so they can be distinguished from connectors that are connected with a one-to-one correspondence. In the example in FIG. 3B, assume that when data that is to be transmitted by the input port PortB but is instead received at the output port PortA the user changes the LSB (Least Significant Bit) of the data because of the computation model. This change affects the input port PortC, but it may not be noted if the user is unaware that multiple connections have been established. Thus, when connections are established for multiple connectors, these connectors are so displayed that they can be distinguished from connectors for which there is a one-toone connection correspondence, so that a user will note and not overlook the multiple connections.

Figure 4:
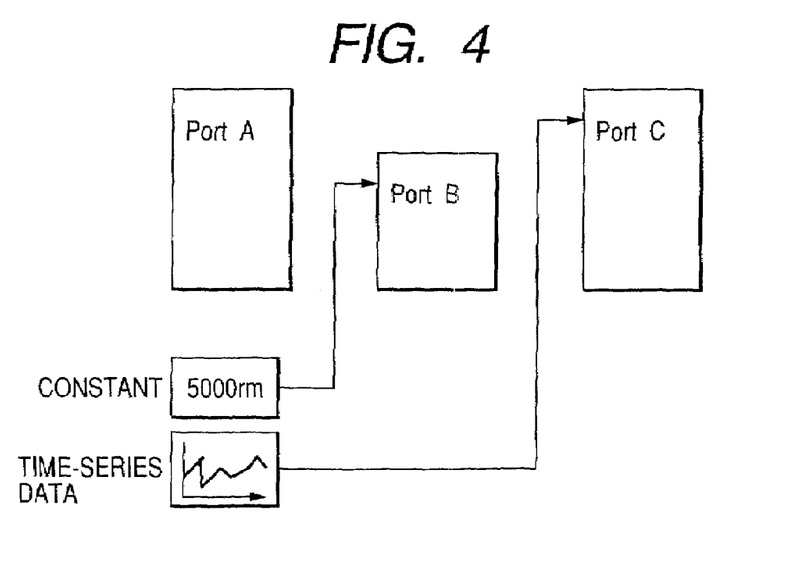
FIG. 4 is a simplified block diagram showing the state wherein time series data or constant data included in the system are set.

FIG. 4 is a diagram showing an example wherein connectors are set for time series data or a constant included in the system, instead of the input boards 13, 14 and 15, the model computing portion 16 and the output boards 17, 18 and 19. The time series data is set using the name of a data file, and it is preferable that the input ports PortB and PortC, which are connectors by which such specific data is received, be displayed so they can be identified and distinguished from other connectors, such as PortA. This is done because, since specific data, such as constant data or time series data, tend to change each time a measurement or a simulation is performed, their connectors can be distinguished from other connectors and the connection changed quickly, thus enabling the setting to be performed efficiently.

Figure 5A:
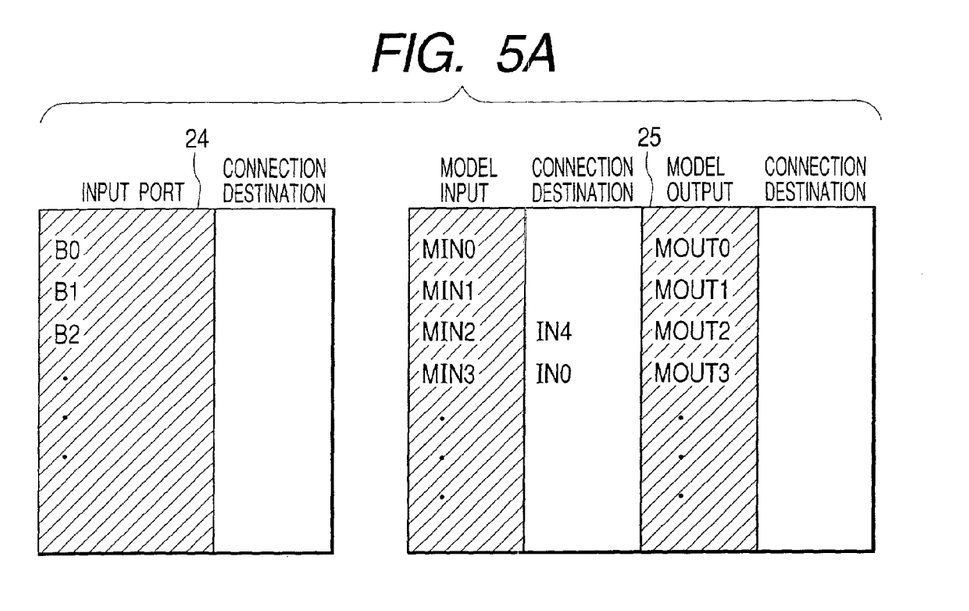
FIGS. 5A and 5B are diagrams showing the state according to the embodiment in FIG. 1 wherein lists are displayed hierarchically.
Figure 5B:
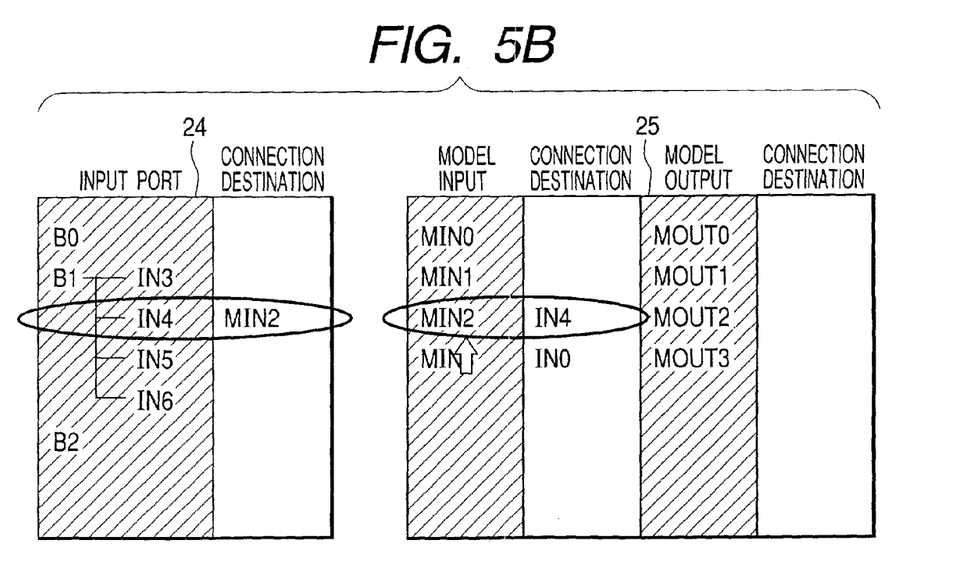

FIGS. 5A and 5B are diagrams showing the state wherein multiple connectors in one of the displayed lists, i.e., the list 24, are sorted into multiple ranks and the topmost rank of the list is displayed, and wherein, when a mouse is used to designate the processed connector and the destination connector thereof is not displayed on the list 24, the hierarchical structure is extended and displayed, beginning with the topmost rank, until the pertinent connector is reached. In FIG. 5A, input boards B0, B1, . . . are displayed as input ports in the topmost rank of the list 24. When multiple boards, such as the input boards 13, 14 and 15 or the output boards 17, 18 and 19, are provided, these boards can be managed by establishing folders for the individual boards. It should be noted, however, that at the topmost rank the list is displayed for each board, and it is difficult to identify the connection relationship. Therefore, when a specific processed connector is designated, as is shown in FIG. 5B, the destination connector is automatically displayed at the same position in the row, and if the destination connector is hidden in the folder, the folder is opened to display it.

When the model input terminal MIN2 is connected to the input port IN4 of the input board B1, the folder for the input board B1 is automatically opened, and the input port IN4 in the folder is displayed in the row for the MIN 2. In this manner, even when a connector is hidden under a folder, the user need only designate the connector to immediately identify the connector of the board to which the connector is connected. Further, since only the connector in the topmost rank of the multiple ranks is displayed, instead of the list of all the many connectors being displayed, the connectors can be displayed so they can be easily identified. Multiple ports maybe grouped in accordance with their functions, and the groups may be assembled into folders as intermediate ranks between the port and the board. Further, when many boards are provided, they may be grouped for handling in accordance with an analog signal or a digital signal, and the group of boards may be employed as the topmost folder.

Figure 6:
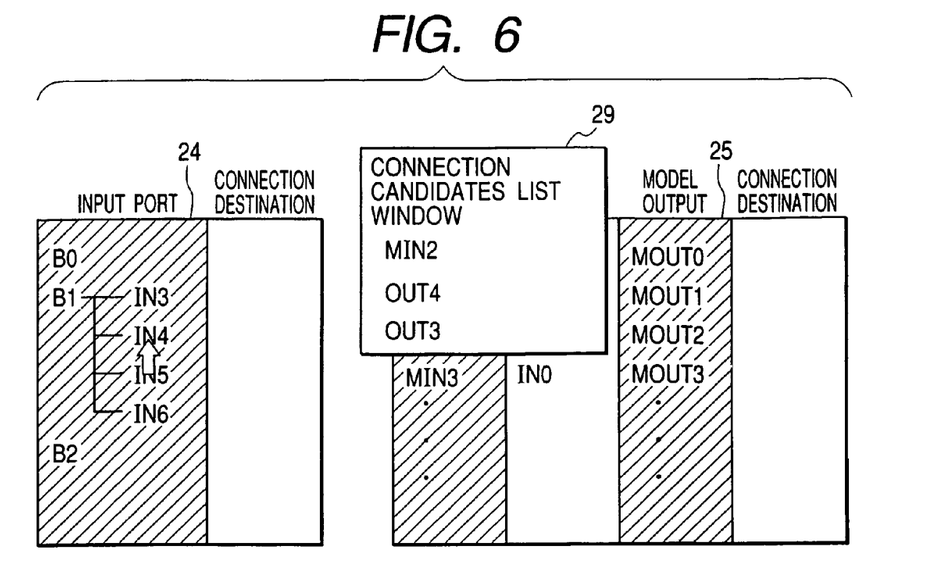
FIG. 6 is a diagram showing the state according to the embodiment in FIG. 1 wherein connection candidates for an unprocessed connector are displayed together with the lists.

FIG. 6 is a diagram showing the state wherein, when input port IN4 is designated as an unprocessed connector, the connectors MIN2, OUT4 and OUT3 are selected, in accordance with a reference determined in advance, as destination candidates from the list 25 and are displayed in a connection candidate list window 29 near the list 25. The selection of the candidates is performed by the personal computer 21 that also serves as the candidate selection section. When the user employs the input device 23 to designate an unprocessed connector, connection candidates are selected, and are displayed in the connection candidate list window 29 near the designated connector. Thus, the user can employ the input device 23 to determine and to designate an appropriate connector.

This function can select multiple candidates based on the similarity of the names of the connectors. When the model computing portion 16 calculates the number of engine revolutions and outputs the results through an output board, such as a pulse board, the engine revolution output port of the model computing portion 16 is named m_out_NE, and the output port of the pulse board is named p_out_NE. "m_out_" and "p_out_" are used as prefixes that represent the attributes of the ports, and the connection destination is determined by the characters in upper case that follow the prefix. In this case, the connectors having "NE" as the prefix are selected as candidates, and are listed in the connection candidate window 29. When the connectors are named while the characters in upper case are so defined that overlapping is avoided, the candidates can be more accurately detected.

For the selection of a candidate, a connection example may be employed as a connection reference in a database, and connection destination candidates may be selected in accordance with the database. Assume that a user enters, in advance, as file information that the connection candidate for a_in_THR is m_in_TA. During the process performed to select connection candidates, the personal computer 21 that serves as the candidate selection section reads the file information and lists the selected candidates.

Instead of listing the candidate information, the user can create a database based on previous connection examples, or can correct the database that has already been created. When in the past "a_in_THR" and "m_in_TA" were connected, "m_in_TA" is automatically stored as a connection candidate for "a_in_THR". And when "a_in_THR" is currently not connected, based on the stored information, "m_in_TA" is selected as a connection candidate for "a_in_THR" and is displayed in the list in the connection candidate window 29. Since based on the connection record for the connectors that were previously connected, the reference for the selection of a connection candidate for an unprocessed connector is corrected, the connection trend evidenced by the selections of a user can be learned, and a candidate that closely reflects the desires of the user can be selected.

According to the method that has been described, the connection candidates are displayed in another window, such as the connection candidate window 29, and the actual connection is performed in accordance with an instruction received from a user. This process can also be automatically performed by a system, such as the personal computer 21. Since multiple candidates may be selected, a connector at the highest preference level is selected while taking into account the preference levels. For a selection based on the similarity between names, the highest preference level is provided for a candidate having the greatest number of matching characters. Further, when the user creates a file and designates a connection destination, the preference level need not be taken into account because only one candidate must be entered. And when connection examples accumulated in the past are employed as references, the connection destination that was selected most frequently is employed as a preference. In addition, multiple references may be employed to determine the preference order, and from such a group the candidates may be selected. If this method is used, candidates can be selected more effectively than when only one reference is employed for the candidate selection, and since the candidate having the highest preference level is selected and is connected to the unprocessed connector, the amount of labor required of the user can be reduced.

As is described above, according to the invention, in the data computation apparatus, to perform a measurement or a simulation the internal computing portion performs a computation based on the data received by the input unit having multiple input ports, and the output unit having output ports outputs the computation results. Further, the list display unit displays, on the screen, lists of connector groups in the order of the arrangement of the input ports, the input terminals, the output terminals and the output ports, and the input operation unit can issue a connection instruction using the drag-and-drop function while designating a connector on an adjacent list. Thus, even when there are many connectors to be connected, a connection relationship can be easily established as the process is being performed.

According to the invention, since different colors are employed for processed and unprocessed connectors, it is possible to prevent an adjustment by an electronic controller serving as a data computation apparatus while there remain connectors that have not been connected.

According to the invention, when the connection state is to be changed, it is affected much greater by a connector that has multiple connections than it is by a connector that has a single connection. Thus, since multiple and single connections can be readily identified, this ensures that a user will be aware of multiple connections and will not overlook them.

According to the invention, the connection of a connector to specific constant data, which tends to change each time a measurement or a simulation process is performed, can be efficiently established, while the connecter can easily be distinguished from other connectors.

According to the invention, since connectors are hierarchically displayed in a list, even when many connectors are provided, the connectors can be displayed so they are easily identified, and for a portion wherein a connection relationship is to be confirmed, the hierarchical structure need only be displayed beginning with the topmost connector and continuing until a designated connector is reached.

According to the invention, when a user enters a connection instruction for an unprocessed connector, connection candidates are displayed near the designated connector. Thus, the user can easily determine and select an appropriate connector as a connection destination.

According to the invention, since an automatic connection to an unprocessed connection can be established, the labor required of a user can be reduced.

According to the invention, connection candidates for an unprocessed connector can be appropriately selected in accordance with the rule that a user employs to name a connector.

According to the invention, connection candidates for an unprocessed connector can be selected based on a correlation file that is set up by a user.

According to the invention, since the reference for selecting connection candidates for an unprocessed connector is corrected based on connection records accumulated in the past, candidates can be selected that most nearly reflect the desires of a user.

According to the invention, the data computation apparatus can be employed for the development or the production of an electronic controller, and an object to be controlled can be simulated so that the electronic controller can be appropriately adjusted.

What is claimed is:

1. A data computation apparatus comprising:
   an input unit including a plurality of input ports for data input;
   an output unit including a plurality of output ports for data output;
   an internal computing portion including a plurality of input terminals connectable to the input ports of the input unit and a plurality of output terminals connectable to the output ports of the output unit, the internal computing portion for performing computation based on data received by the input unit and to output computation results from the output unit;
   a list display unit for displaying on a screen a plurality of adjacent lists of connectors arranged in order of a list of the input ports of the input unit, a list of the input terminals of the internal computing portion, a list of the output terminals of the internal computing portion and a list of the output ports of the output unit, each of the lists being separately grouped as a connector;
   an input operation unit for designating the connectors on adjacent lists by a drag-and-drop operation to issue a connection instruction; and
   a connection controller for logically connecting the connectors on adjacent lists in response to the connection instruction by the input operation unit.

2. The data computation apparatus according to claim 1, wherein the list display unit displays the lists to distinguish connected connectors from unconnected connectors.

3. The data computation apparatus according to claim 2, wherein the list display unit displays the lists to distinguish between one-to-one and one-to-many connections between connectors.

4. The data computation apparatus according to claim 2, wherein the input operation unit provides constant data for at least one connector; and
   the list display unit displays the lists to distinguish the at least one connector provided with the constant data from the unconnected connectors and the connected connectors.

5. The data computation apparatus according to claim 1, wherein each of the lists has a hierarchical structure in which the connectors in one of the lists is classified into a plurality of ranks;
   the list display unit displays the connectors in the topmost rank of the lists; and
   one of the connectors is not displayed on the list regardless of designation of the one of the connectors by the input operation unit, the hierarchical structure is extended and displayed from the topmost rank to a rank including the one of the connectors to display the one of the connector designated by the input operation unit.

6. The data computation apparatus according to claim 1, further comprising a candidate selection section for selecting connectors as connection destination candidates in accordance with a predetermined reference,
   wherein the list display unit displays, in the vicinity of a designated unprocessed connector, the connectors selected as the connection destination candidates by the candidate selection section.

7. The data computation apparatus according to claim 5, further comprising a candidate selection section for selecting connectors as destination candidates for an unconnected connector together with preference levels and in accordance with a predetermined reference,
   wherein the connection controller connects the unconnected connector to a connector having the highest preference level in the destination candidates.

8. The data computation apparatus according to claim 6, wherein a name is provided for each of the connectors in accordance with a rule determined in advance; and the candidate selection section selects the candidates based on matching or similarity of the name provided for the connectors.

9. The data computation apparatus according to claim 6, wherein the predetermined reference is established using a file indicating a correlation in the candidate selection section.

10. The data computation apparatus according to claim 6, wherein the candidate selection section corrects the predetermined reference based on the record of past connections.

11. A method for employing a data computation apparatus to adjust an electronic controller, the method comprising the steps of:
   employing the data computation apparatus to perform data computations for simulating the movement of an object to be controlled; and
   adjusting the electronic controller,
   wherein the data computation apparatus comprises:
   an input unit including a plurality of input ports for data input;
   an output unit including a plurality of output ports for data output;
   an internal computing portion including a plurality of input terminals connectable to the input ports of the input unit and a plurality of output terminals connectable to the output ports of the output unit, the internal computing portion for performing a computation based on data received by the input unit and to output computation results from the output unit;
   a list display unit for displaying on a screen a plurality of adjacent lists of connectors arranged in order of a list of the input ports of the input unit, a list of the input terminals of the internal computing portion, a list of the output terminals of the internal computing portion and a list of the output ports of the output unit, each of the lists being separately grouped as a connector;
   an input operation unit for designating the connectors on adjacent lists by a drag-and-drop operation to issue a connection instruction; and
   a connection controller for logically connecting the connectors on adjacent lists in response to the connection instruction by the input operation unit.

12. A data computation apparatus comprising:
   an input unit including a plurality of input ports;
   an output unit including a plurality of output ports;
   a computing portion including a plurality of input terminals connectable to the input ports of the input unit and a plurality of output terminals connectable to the output ports of the output unit, the computing portion performing a computation based on data received by the input unit and outputting a computation result via the output unit;
   a list display unit that displays on a screen a plurality of lists of connections among the input ports of the input unit, the input terminals of the computing portion, the output terminals of the computing portion, and the output ports of the output unit, and displays a list of the input ports of the input unit, a list of the input terminals of the computing portion, a list of the output terminals of the computing portion, and a list of the output ports of the output unit, each of the lists being separately grouped as a connector;
   an input unit operation unit that designates at least two of the input ports, the input terminals, the output terminals, and the output ports from the lists of the input ports, the input terminals, the output terminals, and the output ports in response to a user's operation to issue a connection instruction; and
   a connection controller that logically connects the designated at least two terminals/ports in response to the connection instruction and displays a connecting result on the lists of connections.

13. A method for connecting connectors between an input unit and a computing portion, and connecting connectors between an output unit and the computing portion, wherein:
   the input unit includes a plurality of input ports;
   the output unit includes a plurality of output ports;
   the computing portion includes a plurality of input terminals connectable to the input ports of the input unit and a plurality of output terminals connectable to the output ports of the output unit; and
   the computing portion performs computation based on data received by the input unit, and outputs a computation result via the output unit, the method comprising:
   displaying on a screen a plurality of lists of connections among the input ports of the input unit, the input terminals of the computing portion, the output terminals of the computing portion, and the output ports of the output unit;
   displaying a list of the input ports of the input unit, a list of the input terminals of the computing portion, a list of the output terminals of the computing portion, and a list of the output ports of the output unit, each of the lists being separately grouped as a connector;
   designating at least two of the input ports, the input terminals, the output terminals, and the output ports from the lists of the input ports, the input terminals, the output terminals, and the output ports in response to a user's operation to issue a connection instruction; and
   logically connecting the designated at least two terminals/ports in response to the connection instruction and displaying a connecting result on the lists of connections.

* * * * *

UNITED STATES PATENT AND TRADEMARK OFFICE
CERTIFICATE OF CORRECTION

| | | |
|---|---|---|
| PATENT NO. | : 7,076,739 B2 | Page 1 of 1 |
| APPLICATION NO. | : 10/104029 | |
| DATED | : July 11, 2006 | |
| INVENTOR(S) | : Takeshi Yasuda | |

It is certified that error appears in the above-identified patent and that said Letters Patent is hereby corrected as shown below:

Title page,
Item [73], change "Fujitsu Limited" to --Fujitsu Ten Limited--.

Signed and Sealed this

Sixteenth Day of January, 2007

JON W. DUDAS
*Director of the United States Patent and Trademark Office*